United States Patent
Kugimiya et al.

(10) Patent No.: US 8,172,961 B2
(45) Date of Patent: *May 8, 2012

(54) AL-NI-RARE EARTH ELEMENT ALLOY SPUTTERING TARGET

(75) Inventors: Toshihiro Kugimiya, Kobe (JP);
Katsutoshi Takagi, Kobe (JP); Hitoshi Matsuzaki, Takasago (JP); Kotaro Kitashita, Takasago (JP); Yoichiro Yoneda, Takasago (JP)

(73) Assignees: Kobe Steel, Ltd., Kobe-shi (JP);
Kobelco Research Institute, Inc., Kobe-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/861,330

(22) Filed: Aug. 23, 2010

(65) Prior Publication Data

US 2011/0048936 A1 Mar. 3, 2011

Related U.S. Application Data

(63) Continuation of application No. 11/341,531, filed on Jan. 30, 2006, now Pat. No. 7,803,238.

(30) Foreign Application Priority Data

Feb. 15, 2005 (JP) .................. 2005-037937

(51) Int. Cl.
*C23C 14/14* (2006.01)
(52) U.S. Cl. .................. 148/437; 204/298.13
(58) Field of Classification Search .......... 148/437; 204/298.13
See application file for complete search history.

(56) References Cited

U.S. PATENT DOCUMENTS

| | | | |
|---|---|---|---|
| 4,743,317 A | 5/1988 | Skinner et al. | |
| 4,814,053 A | 3/1989 | Shimokawato | |
| 5,514,909 A | 5/1996 | Yamamoto et al. | |
| 6,033,542 A | 3/2000 | Yamamoto et al. | |
| 6,096,438 A | 8/2000 | Takagi et al. | |
| 6,159,625 A | 12/2000 | Ueno | |
| 6,218,206 B1 | 4/2001 | Inoue et al. | |
| 6,252,247 B1 | 6/2001 | Sakata et al. | |
| 6,737,101 B2 | 5/2004 | Maa | |
| 2002/0014406 A1 | 2/2002 | Takashima | |
| 2004/0126608 A1 | 7/2004 | Gotoh et al. | |
| 2005/0184395 A1 | 8/2005 | Gotoh et al. | |
| 2005/0224795 A1 | 10/2005 | Gotoh et al. | |
| 2006/0007366 A1 | 1/2006 | Gotoh et al. | |
| 2008/0081532 A1 | 4/2008 | Okuno | |
| 2008/0121522 A1 | 5/2008 | Ehira et al. | |
| 2008/0223718 A1 | 9/2008 | Takagi et al. | |

FOREIGN PATENT DOCUMENTS

| | | |
|---|---|---|
| EP | 0 339 676 | 11/1989 |
| EP | 0 354 391 | 2/1990 |
| GB | 2 239 874 | 7/1991 |
| JP | 7-316755 | 12/1995 |
| JP | 9-248665 | 9/1997 |
| JP | 10-60636 | 3/1998 |
| JP | 10-199830 | 7/1998 |
| JP | 11-106905 | 4/1999 |
| JP | 11-269620 | 10/1999 |
| JP | 2001-214261 | 8/2001 |
| JP | 2003-342659 A | 12/2003 |
| JP | 2004-214606 | 7/2004 |
| TW | 200415429 A | 8/2004 |

*Primary Examiner* — Jie Yang
(74) *Attorney, Agent, or Firm* — Oblon, Spivak, McClelland, Maier & Neustadt, L.L.P.

(57) ABSTRACT

An Al-base alloy sputtering target consisting Ni and one or more rare earth elements, wherein there are $5.0\times10^4/mm^2$ or more compounds whose aspect ratio is 2.5 or higher and whose equivalent diameter is 0.2 μm or larger, when a cross sectional surface perpendicular to the plane of the target is observed at a magnification of 2000 or higher.

6 Claims, 2 Drawing Sheets

AL-NI-RARE EARTH ELEMENT ALLOY SPUTTERING TARGET

CROSS-REFERENCE TO RELATED APPLICATIONS

The present application is a continuation of U.S. Ser. No. 11/341,531 (now U.S. Pat. No. 7,803,238), filed Jan. 30, 2006, which claims priority to JP 2005-037937, filed Feb. 15, 2005.

BACKGROUND OF THE INVENTION

1. Field of the Invention

The present invention relates to an Al—Ni-rare earth element alloy sputtering target, and more particularly, to such an Al—Ni-rare earth element alloy sputtering target which can be produced favorably even when the target is to be made large and with which it is possible to realize stable sputtering which does not accompany major warp of the target.

While the sputtering target according to the present invention is applicable to an interconnection film which forms a liquid crystal panel, an organic EL panel or the like for use in a television set, a laptop computer, a monitor or other display, a reflection film, a recording film and the like for use in the field of optical recording, an interconnection film and the like in the field of semiconductor devices, use of the sputtering target according to the present invention for a liquid crystal panel will be described below as a typical application.

2. Description of the Related Art

A liquid crystal panel of the active matrix type includes a TFT array substrate which uses thin film transistors (TFTs) as switching elements and includes pixel electrodes (transparent conductive film) and interconnection portions which may be scanning lines, signal lines and the like, an opposed substrate which includes a common electrode and is disposed over a predetermined distance facing the TFT array substrate, and a liquid crystal layer which is injected between the TFT array substrate and the opposed substrate.

The signal lines in the liquid crystal panel are sections which are electrically connected with the pixel electrodes, and are generally made of aluminum alloy. However, direct contact of the aluminum alloy (film) and the pixel electrodes produces aluminum oxide or the like, which is an insulation material, at the interface between the two and increases the electrical resistance there, a conventional solution to which is generally interposition of a film of refractory metal, such as Mo, Cr, Ti and W, as barrier metal between the aluminum alloy and the pixel electrodes. In the meantime, the recent years have seen an attempt for a simplified producing process by means of omission of such a film of high-melting-point metal and direct connection of the signal lines (aluminum alloy) and the pixel electrodes (transparent conductive film), and use of Al—Ni alloy for example as the aluminum alloy has been proposed for reduction of the insulation material such as aluminum oxide and hence reduction of the electrical resistance (Patent Document 1; JP, 2004-214606, A). Patent Document 1 also describes addition of Nd, Y, Fe or the like as the third element makes it possible to enhance the heat resisting property of the interconnection film and improve the electrical characteristics owing to smaller crystal grains and smaller intermetallic compounds in the structure.

Sputtering is generally used to form a thin film such as the interconnection film above. Sputtering is a method according to which plasma discharge is developed between a substrate and a target material which serves as a film material, gas ionized by the plasma discharge collides with the target material, the atoms of the target material are ejected and accumulated as a thin film on the substrate and is advantageous in that it achieves production of a thin film of the same composition as that of the target material unlike where a vacuum deposition or AIP method is used.

Targets for production of the aluminum alloy film which have been so far proposed include the aluminum alloy having substantially reduced crystal grain diameters according to Patent Document 2 (JP, 11-106905, A), very fine compounds as those described in Patent Document 3 (JP, 2001-214261, A), Patent Document 4 (JP, 10-199830, A), etc. It is shown that remarkably fine and small crystal grains or compounds reduce splashing during film deposition and secure the uniform composition and film thickness of the thin resultant film.

By the way, while the larger size of a liquid crystal display panel or the like urgently demands increase of the size of a target for fabrication of the liquid crystal display panel, manufacturing of a large-size target still needs reduced splashing, better characteristics of a thin film to produce, and additionally, suppressed warp of the target attributable to heating during producing or use.

Warp of the target which occurs during producing may be warp of a plate at the stage of mechanical processing due to the residual stress which remains after rolling or straightening, thermal deformation during bonding to a cooling plate, etc., and if such deformation is excessive, not only the accuracy of the product but the productivity as well deteriorate. Meanwhile, thermal deformation which occurs during use includes deformation caused by repeated heating and cooling during film deposition, and such excessive deformation during use causes a problem that a solder material which bonds the target with the cooling plate cracks, the target locally fails to get cooled and the solder material melts and gets peeled off from the cooling plate.

The present invention has been made in light of the problems above, and accordingly, aims at providing an Al—Ni-rare earth element alloy sputtering target which does not accompany major deformation (warp) during producing and use, and can be produced precisely and efficiently even when the target is to be made large, and with which it is possible to realize stable film deposition.

SUMMARY OF THE INVENTION

The target according to the present invention is an Al-base alloy sputtering target containing Ni and one or more rare earth elements, wherein there are $5.0 \times 10^4/mm^2$ or more compounds whose aspect ratio is 2.5 or higher and whose equivalent diameter is 0.2 µm or larger, when a cross sectional surface perpendicular to the plane of the target is observed at a magnification of 2000 or higher.

It is preferable that when the cross sectional surface perpendicular to the plane of the target is observed at a magnification of 2000 or higher, (a) the major axis direction of 80% or more of the compounds are within the range of ±30 degrees with respect to the direction which is parallel to the plane of the target, and (b) the number of bulky compounds whose equivalent diameter exceeds 5 µm is $500/mm^2$ or fewer.

For improvement of the heat resisting property, the rare earth element is one or more elements selected from the group consisting of Nd, Y and Dy. The aspect ratio in this context is (the maximum length)/(the length along the direction orthogonal to the maximum length) of each compound.

According to the target of the present invention, even when used as a large-size sputtering target, the target does not get deformed (warp) greatly even during rolling, bonding to a cooling plate and repeated use for film deposition.

This makes it possible to precisely produce a target of a specified size in an easy manner. This also attains easy bonding to a cooling plate and allows omission of straightening. Further, this suppresses cracking of a solder material between a target material and a cooling plate due to repeated heating and cooling during use and prevents separation of the sputtering target from the cooling plate, which in turn secures efficient and excellent deposition of an Al alloy interconnection and electrode films or the like for a long time during steps of producing a liquid crystal display for instance.

While aiming at solving the problems associated with a large-size, target which warps particularly greatly, the present invention is applicable of course also to a medium or small target which does not warp as much as a large target does.

DETAILED DESCRIPTION OF THE PREFERRED EMBODIMENT

The inventors of the present invention devoted themselves to development of an Al—Ni-rare earth element alloy sputtering target which is used for deposition of a useful an Al—Ni-rare earth element alloy thin film, which does not accompany major deformation (warp) during producing and use, and can be produced precisely and efficiently even when the target is to be made large, and with which it is possible to realize excellent sputtering. As a result, the inventors made the present invention based on the findings that the existence of compounds herein defined within a target would serve the purpose.

Describing more specifically, the inventors found that the existence of compounds whose aspect ratio was 2.5 or higher and whose equivalent diameter was 0.2 µm or larger which were observed in a cross sectional surface perpendicular to the plane of a target would sufficiently suppress deformation of the target.

Figure 1:
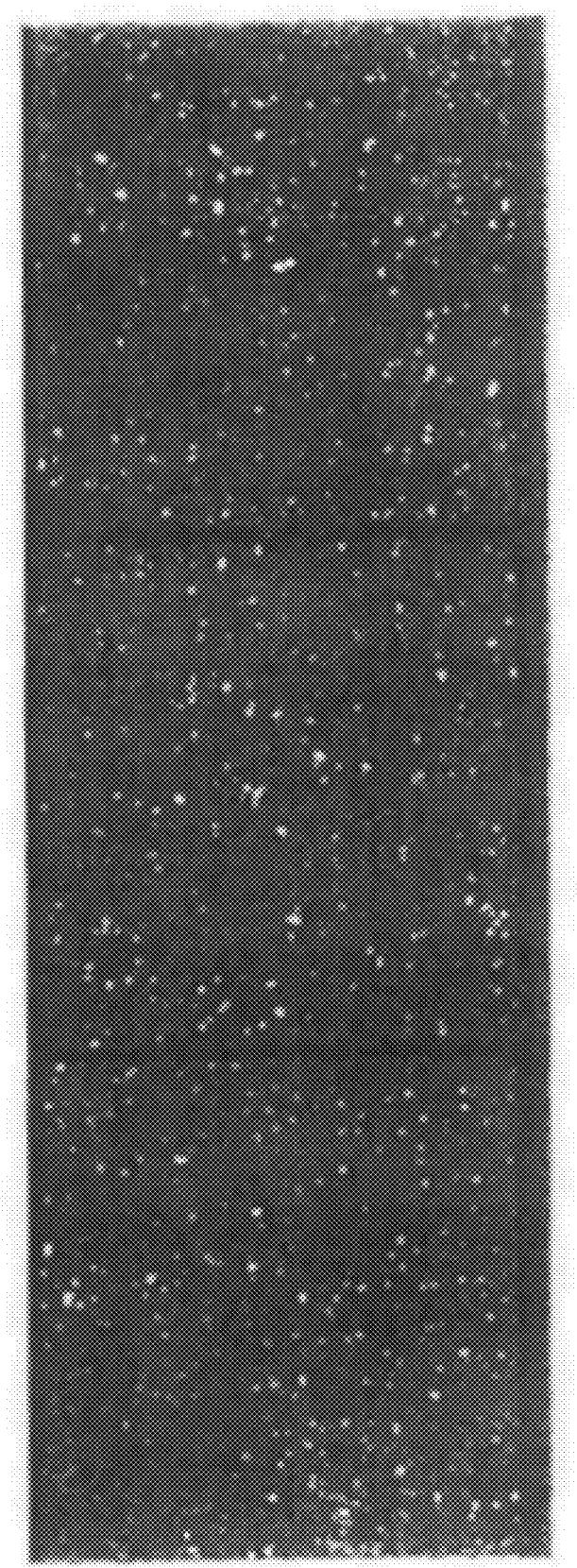
FIG. 1 is an SEM photograph (taken at a magnification of 2000) of a cross sectional surface of a conventional sputtering target.

The aspect ratio is set to 2.5 or higher as the compounds above are stronger than that of an Al matrix and are believed to contribute to improvement of the strength of the target, and also because it has been confirmed that the existence of such compounds which appear rod-shaped in a cross sectional surface of the target in particular effectively increases the strength than the existence of circular (sphere-like) compounds does. FIG. 1 shows, as a comparison, an SEM photograph (shot at three freely chosen locations where the thickness is from ($\frac{1}{4}$)t through ($\frac{3}{4}$)t of the thickness t of the target) of a cross sectional structure of an Al-0.6at % Nd alloy target. When compounds observed in a cross sectional surface of the target are shaped like circles as shown in FIG. 1, it is difficult to sufficiently prevent deformation.

Even when the aspect ratio of the compounds is 2.5 or higher, if the compounds are not large enough to a certain extent or larger, the compounds will not sufficiently contribute to improvement of the strength of the target and will not satisfactorily exhibit the deformation preventive effect. Noting this, the present invention requires the existence of such compounds whose aspect ratio is 2.5 or higher and whose equivalent diameter is 0.2 µm or larger (hereinafter referred to as the "specified compounds").

A requirement in accordance with the present invention is that a cross sectional surface perpendicular to the plane of a target observed at a magnification rate of 2000× at least or higher shows $5.0 \times 10^4$/mm² or more specified compounds. This is because if the number of the specified compounds is less than this, it is not possible to sufficiently enhance the strength of the target and securely suppress deformation. The specified compounds preferably exist in the amount of $6.0 \times 10^4$/mm² or more, and more preferably, $8.0 \times 10^4$/mm² or more.

The number of the specified compounds may be found by observing and shooting the cross sectional surface perpendicular to the plane of the target at a magnification of 2000 at least as described above using SEM equipment and by analyzing the image of thus obtained SEM photographs. Sections to observe should not include a surface layer portion of the cross section, and observation of those sections where the thickness is from ($\frac{1}{4}$)t through ($\frac{3}{4}$)t of the thickness t of the target is recommended. During observation, the target should be observed at a few places (preferably at three or more locations) and an average value should be used.

Figure 2:
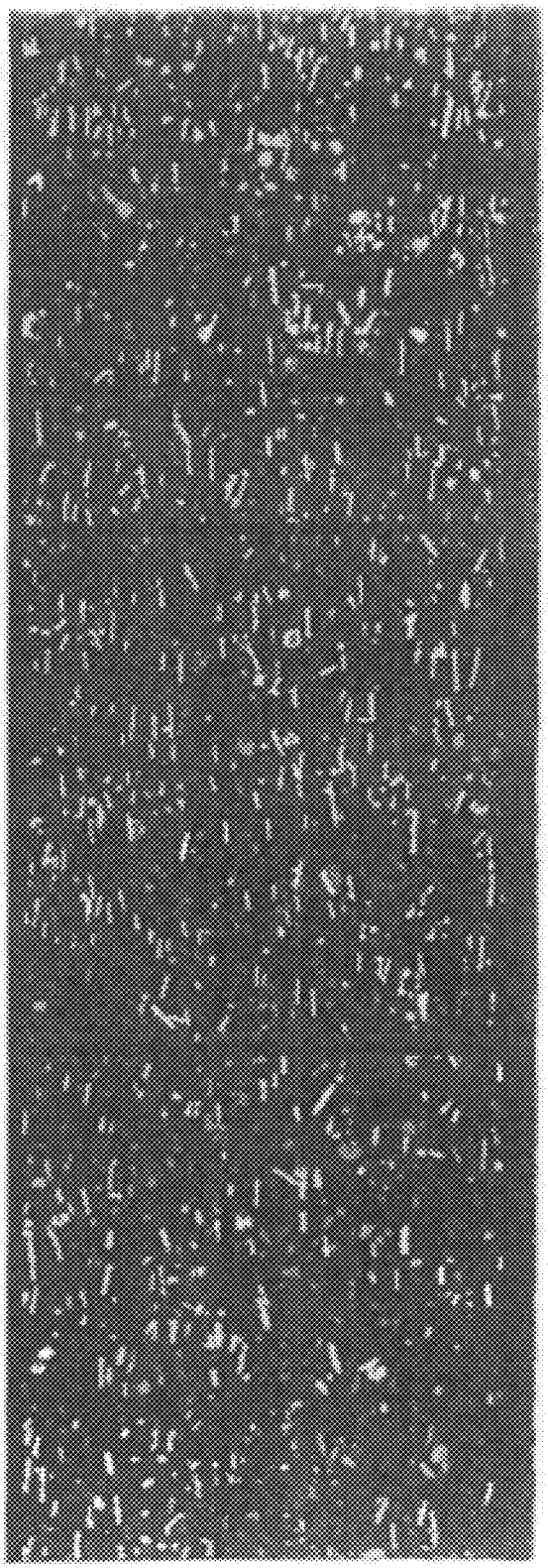
FIG. 2 is an SEM photograph (taken at a magnification of 2000) of a cross sectional surface of the sputtering target according to the present invention.

FIG. 2 shows for reference an SEM photograph (shot at three freely chosen locations where the thickness is from ($\frac{1}{4}$)t through ($\frac{3}{4}$)t of the thickness t of the target) of the cross section of an Al-2at % Ni-0.6at % Nd alloy target which satisfies the requirements above. According to FIG. 2, it is seen that there are numerous rod-shaped compounds unlike in FIG. 1. The gray compounds shaped like circular plates in FIG. 2 do not satisfy the requirements above and are believed to be hardly influential over improvement of the strength of the target. Those compounds shaped like circular plates should nevertheless be reduced in number down to a recommendable level, as such compounds when bulky could adversely affect film deposition as described later.

It is preferable that the major axis direction of the specified compounds mentioned above is oriented along the rolling direction (namely, the direction of the plane of the target) when observed within the cross sectional surface perpendicular to the plane of the target at a magnification of 2000 or higher. When the specified compounds are found to align along the parallel direction to the plane of the target when observed within the cross sectional surface perpendicular to the plane of the target, defects attributable to pushing during mechanical processing are shallow. This also suppresses abnormal discharge during initial use of the target, and prevents a deteriorated yield of FPDs (flat panel displays), unsatisfactory operation capabilities and the like caused by defects in the thin film.

More specifically, it is desirable that the major axis direction of 80% or more of the specified compounds (which are compounds whose aspect ratio is 2.5 or higher and whose equivalent diameter is 0.2 µm or larger) are within the range of ±=30 degrees with respect to the direction which is parallel to the plane of the target. Preferably, 85% or more of the specified compounds described above satisfy the requirement, and more preferably, the major axis direction of 90% or more of the specified compounds are within the range of ±30 degrees with respect to the direction which is parallel to the plane of the target.

For suppression of initial abnormal discharge during film deposition, it is recommended not to allow the existence of bulky compounds. While the present invention is characterized in permitting the existence of the specified compounds which are large enough to a certain extent or larger, the excessively large size of the specified compounds develop abnormal discharge at the stage of sputtering during initial use of the target. Further, since the specified compounds above are hard, when the specified compounds are pushed in during machine work, defects could be produced. In addition, not only the specified compounds described above but bulky compounds shaped like circular plates as those shown in FIG. 2 could also result in inconvenience during film deposition. Hence, it is recommendable to suppress the number of bulky compounds whose equivalent diameter exceeds 5 μm down to 500/mm² or less, irrespective of the shapes of the compounds (aspect ratios). The number of such bulky compounds should be preferably reduced down to 300/mm² or less.

The orientation of the compounds above, the number of the bulky compounds above and the like may be identified by observing and shooting the cross sectional surface perpendicular to the plane of the target, at an increased magnification of 2000 at least as described above using the SEM equipment above and by analyzing the image of thus obtained SEM photographs. In this instance as well, it is recommended to observe and shoot at plural locations where the thickness is from (¼)t through (¾)t of the thickness t of the target.

Although the present invention does not specify a method of producing the sputtering target described above, a producing method which utilizes spray forming is recommended among the conventionally performed methods. This is because producing in accordance with this method easily produces a sputtering target containing the compounds specified in the present invention and thus produced target is of a uniform material in which an alloy element is dissolved or dispersed evenly in Al which is the matrix phase.

A producing method which utilizes spray forming may be the following process. That is, a melting material is dropped down from a nozzle, $N_2$ gas for example is sprayed against the droplets, thereby pulverizing the material, and an intermediate material (whose concentration is approximately from 50 to 60%) which is called a pre-form is made while the powdery material is yet to completely coagulate. This intermediate material is then encapsulated, degassed, pressed using an HIP (Hot Isostatic Pressing) machine, forged into a plate-shaped material, rolled so that the plate thickness is approximately the same as that of the target, annealed and then mechanically processed.

To obtain the specified compounds above, it is recommendable to control the diameter of the nozzle and the spray gas pressure (hereinafter referred to as the "gas pressure") particularly at the spray forming step for adjustment of the cooling speed. This is because the compounds specified in the present invention are not obtained by rolling which will be described later and because it has been experimentally verified that the shapes and the sizes of these compounds are determined by a spray forming condition.

As for the nozzle diameter and the gas pressure, generally speaking, the nozzle diameter (φ) is from 2.5 to 10 mm and the gas pressure is from 0.3 to 1.5 MPa to obtain an Al alloy material by spray forming. However, it is important in the present invention to strictly control the nozzle diameter (φ) to 3.0 through 5.5 mm (preferably the diameter (φ) is from 3.3 through 4.5 mm) and strictly control the gas pressure in the range from 0.6 through 0.9 MPa (or preferably from 0.65 through 0.85 MPa).

When the nozzle diameter is smaller than 3 mm, the flow rate of the molten Al alloy slows down and the cooling speed increases relative to the flow rate, and therefore, compounds will not grow almost at all in one direction but rather stay round and compact, which means it will be difficult to obtain the specified compounds. On the contrary, when the nozzle diameter is beyond 5.5 mm, the flow rate of the molten Al alloy becomes faster and the cooling speed slows down relative to the flow rate, and therefore, compounds will become bulky. Since this will reduce the number of the compounds, it will be impossible to secure the enough number of the specified compounds.

Meanwhile, when the gas pressure is lower than 0.6 MPa, the cooling speed slows down, which is not desirable as compounds will become bulky and the number of the compounds will decrease as in the case of the excessively large nozzle diameter described above. When the gas pressure exceeds 0.9 MPa, the cooling speed increases, compounds will remain shaped like spheres and it will be impossible to obtain compounds having large aspect ratios as in the case of the excessively small nozzle diameter described above.

The present invention recommends controlling the shapes and the sizes of the compounds depending upon a spray forming condition and thereafter controlling the orientation of the compounds during subsequent rolling as described above. Control of the processing rate in particular among rolling conditions is desirable as it makes it possible to arrange the major axis direction of the specified compounds along the direction which is parallel to the plane of the target.

As for producing of an Al alloy target by rolling, generally adopted conditions are the total working ratio of 45 to 85% and the processing rate per pass of 3 to 10%. However, for enhancement of the orientation of the compounds, it is desirable to increase the total processing rate and the processing rate per pass during rolling. Describing in specific details, the total processing rate of 60% or higher and the processing rate per pass of 5% or higher are recommended.

In the event that the total processing rate is lower than 60%, the orientation of the compounds does not sufficiently improve, which is not preferable. The total processing rate is more preferably 70% or higher. From a standpoint of less burden upon equipment and prevention of a lower productivity, the total processing rate of maximum 85% in accordance with the generally required condition above.

Meanwhile, the processing rate per pass is preferably 5% or higher in the present invention. If the processing rate per pass is lower than this, an area around the surface layer portion alone gets deformed but an area near the center of the plate thickness is rarely deformed, which makes it impossible to sufficiently enhance the orientation of the specified compounds. The processing rate per pass is more preferably 7% or higher.

In the case of an Al alloy material to obtained by the material by spray forming method described above, while it is possible to produce either by cold rolling or by hot rolling since the structure will not easily change during these processing, for a higher processing rate per pass, processing in temperature range of low flow stress after heating the Al alloy material is effective, and therefore, hot rolling is preferable. The recommended heating temperature is from 350 through 450 degrees Celsius.

The other conditions such as those for spray forming, HIP, forging, rolling and the like may be generally accepted conditions (which are described in JP, 9-248665, A for instance).

While the present invention is applicable to an Al-base alloy target containing Ni and one or more rare earth elements and none of the amount of Ni and the type and the amount of the rare earth element is particularly limited, where one plans to use the target according to the present invention for deposition of an electrode film of a display device as that described earlier, 1 through 5 at % of Ni in an Al—Ni-rare earth element alloy target is recommended for reduction of an insulation material which is produced at the interface between thus deposited electrode film (aluminum alloy film) and pixel electrodes. The target to which one or more types selected from the group consisting of Nd, Y and Dy has been added as rare earth elements enhances the heat resisting property of a deposited thin film without fail, which is preferable. For this effect to be felt, it is recommended that the amount of the rare earth elements accounts for 0.1 through 3 at % in the Al—Ni-rare earth element alloy target.

The present invention does not limit the shape or the size of the target but is rather applicable to targets having various shapes such as a rectangular shape and a disk-like shape, noting the fact that deformation such as warp which occurs during producing or use of the target becomes more remarkable as the size of the target is larger, the present invention may be preferably applied to a large-size target which measures 600 mm or longer along one side, which in turn will dramatically suppress such deformation and magnify the effect of the present invention.

The present invention will now be described more specifically in relation to examples. The present invention however is not limited to the examples below but may be implemented after appropriately modified to the extent meeting the intentions mentioned earlier and described below. Those modifications all fall within the technical scope of the invention.

EXAMPLE 1

$N_2$ gas was blown against the Al alloy materials No. 1 through No. 10 and No. 14 through No. 16 having the compositions shown in Table 1 during spray forming under the conditions provided in Table 1, intermediate materials (whose densities were approximately from 50 to 60%) were consequently obtained and then encapsulated and degassed, and thereafter pressed using an HIP machine. These were forged into plate-shaped materials, rolled (at the total processing rate of 80%, the processing rate per pass of 6 through 10% and the finish rolling temperature of 400 degrees Celsius) so that the plate thickness would be approximately the same as that of the final products (targets), annealed (400 degrees Celsius) and then mechanically processed, thereby obtaining Al alloy plates of 8 mm t×600 mm×800 mm. Other conditions for spray forming than those appearing in Table 1 are as follows:
  Superheat: 200 degrees Celsius
  Over pressure: initial . . . 0.003 MPa
    end . . . 0.01 MPa For comparison, the Al alloy materials No. 11 and No. 12 having the compositions shown in Table 1 were dissolved within a vacuum induction melt furnace (i.e., inside a crucible of alumina filled with Ar gas under 100 Torr) at 750 degrees Celsius (superheat), poured into (cylindrical) mold of graphite, and casted. This was followed by forging, rolling, annealing and mechanical processing as in the case of producing by the spray forming method described above, thereby obtaining Al alloy plates of the above size. As for No. 13 in Table 1, after Al power, Al—Nd powder and Ni powder were mixed, the mixture was HIP-processed and pressed, and thereafter forged, rolled, annealed and mechanically processed, thereby obtaining an Al alloy plate of the above size.

A cross sectional surface of each Al alloy plate thus obtained was observed with a microscope and the number of specified compounds was counted. More specifically, using FE-SEM (Quanta 200 FEG, a field emission type scanning electron microscope manufactured by Phillips), under the conditions of the magnification of 2000 and the accelerating voltage of 5 kV, freely chosen three locations where the thickness was from (¼)t through (¾)t within a cross sectional surface perpendicular to the plane of each Al alloy plate were observed (each in the visual field of about 50 μm×about 60 μm), thus taking reflected electronic images. Using the Win-ROOF image analysis software (manufactured by MITANI CORPORATION), image analysis of the digitized SEM photographs was performed, the number of compounds whose aspect ratio was 2.5 or higher and whose equivalent diameter was 0.2 μm or larger was counted, and an average value of the three visual fields in total was calculated and converted into a count per 1 $mm^2$.

In addition, after holding each Al alloy plate on a hot plate heated to 250 degrees Celsius for one hour, the maximum warp was measured. This was followed by evaluation according to which the amount of warp of 2 mm or less meant suppressed deformation (◯), whereas the amount of warp over 2 mm meant significant warp (X). The Table 1 shows the results.

TABLE 1

| | | | Spray Forming Condition | | | |
|---|---|---|---|---|---|---|
| No. | Composition | Process Method | Nozzle Diameter (mm) | Gas Pressure (MPa) | Amount of Compound* (number/$mm^2$) | Warp |
| 1 | Al—2at % Ni—1at % Nd | Spray Forming | 3.5 | 0.8 | 110000 | ◯ |
| 2 | Al—2at % Ni—1at % Y | Spray Forming | 3.5 | 0.8 | 108000 | ◯ |
| 3 | Al—2at % Ni—1at % Dy | Spray Forming | 3.5 | 0.8 | 107000 | ◯ |
| 4 | Al—2at % Ni—0.4at % Nd | Spray Forming | 3.5 | 0.8 | 61000 | ◯ |
| 5 | Al—3at % Ni—0.5at % Nd | Spray Forming | 3.5 | 0.8 | 58000 | ◯ |
| 6 | Al—3at % Ni—0.6at % Nd | Spray Forming | 3.5 | 0.8 | 70000 | ◯ |
| 7 | Al—4at % Ni—0.6at % Nd | Spray Forming | 3.5 | 0.8 | 73000 | ◯ |
| 8 | Al—2at % Ni—2at % Nd | Spray Forming | 3.5 | 0.8 | 125000 | ◯ |
| 9 | Al—2at % Ni—0.5at % Y | Spray Forming | 3.5 | 0.8 | 63000 | ◯ |
| 10 | Al—3at % Ni—0.5at % Y | Spray Forming | 3.5 | 0.8 | 81000 | ◯ |
| 11 | Al—2at % Ni—1at % Nd | Dissolution | — | — | 10000 | x |
| 12 | Al—3at % Ni—0.6at % Nd | Dissolution | — | — | 5000 | x |

TABLE 1-continued

| | | | Spray Forming Condition | | | |
|---|---|---|---|---|---|---|
| No. | Composition | Process Method | Nozzle Diameter (mm) | Gas Pressure (MPa) | Amount of Compound* (number/mm²) | Warp |
| 13 | Al—2at % Ni—1at % Nd | Powder | — | — | 1500 | x |
| 14 | Al—3at % Ni—0.6at % Nd | Spray Forming | 2.2 | 0.95 | 40000 | x |
| 15 | Al—3at % Ni—0.6at % Nd | Spray Forming | 6 | 0.5 | 27000 | x |
| 16 | Al—3at % Ni—0.6at % Nd | Spray Forming | 6.5 | 0.8 | 25000 | x |

*Compounds whose aspect ratio was 2.5 or higher and whose equivalent diameter was 0.2 μm or larger Table 1 indicates the following. With respect to No. 1 through No. 10 in Table 1, since the compounds having the size specified in the present invention are present in the specified amounts, warp of the Al alloy plates would be minor even after heating, and therefore, when these are used as large-size sputtering targets, it would be possible to suppress thermal deformation during producing and use of the targets. On the contrary, as for No. 11 through No. 17 in Table 1, since there are only an insufficient number of compounds having the size specified in the present invention, warp after heating will be significant, which will decrease the productivity of producing the targets and lead to inconvenience during use.

EXAMPLE 2

Al alloy materials obtained by spray forming under the recommended conditions were rolled under various conditions, and the structures of Al alloy plates and the influence over film deposition were examined. More specifically, after obtaining intermediate materials by spray forming under similar conditions to those used for No. 1 through No. 10 described in Example 1, the intermediate materials were encapsulated and degassed, and thereafter pressed using an HIP machine. These were forged into plate-shaped materials, rolled under the conditions shown in Table 2, annealed (400 degrees Celsius) and then mechanically processed, thereby obtaining Al alloy plates of 8 mm t×600 mm×800 mm.

As in Example 1, a cross sectional surface of each Al alloy plate thus obtained perpendicular to the plane of each Al alloy plate was observed with a microscope, and the number of compounds whose aspect ratio was 2.5 or higher and whose equivalent diameter was 0.2 μm or larger was counted. As a result, it was confirmed that there were enough specified compounds for each in this Example.

The orientation of the specified compounds was then identified from SEM photographs. Describing in more details, the number of the specified compounds whose major axis direction was beyond ±30 degrees with respect to the direction which was parallel to the plane of the target was subtracted from the total number of the specified compounds and the result was divided by the total number of the specified compounds, and then the proportion (%) of the specified compounds whose major axis direction was within the range of ±30 degrees with respect to the direction which was parallel to the plane of the target was calculated. An average value of the three visual fields in total was then calculated.

As for the number of bulky compounds, the compounds whose equivalent diameter exceeded 5 μm were measured in the SEM photographs, an average value of the three visual fields in total was calculated and converted into a count per 1 mm².

Next, targets of 5 mm t×ϕ101.6 mm were cut out from the Al alloy plates and subjected to a sputtering test under the conditions below. Through arc monitoring, the number of arcs during the first ten minutes of sputtering was counted. Table 2 shows the results.

Ultimate vacuum: $4.0 \times 10^{-4}$ Pa or less
Ar gas pressure: 0.3 Pa
Ar gas flow rate: 30 sccm ($5 \times 10^{-7}$ m³/s)
Sputter power: 500 W
Anode-cathode distance: 51.6 mm
Substrate temperature: room temperature

TABLE 2

| | | Rolling Conditions | | | Amount of | |
|---|---|---|---|---|---|---|
| No. | Composition | Total Processing Rate (%) | Processing Rate Per Pass (%) | Temp (° C.) | Ratio of Aligned Components (%) *1 | Bulky Compounds (number/ mm²) *2 | Number of Arcs |
| 1 | Al—2at % Ni—1at % Nd | 80 | 6-10 | 400 | 86 | 3.2 | 30 |
| 2 | Al—2at % Ni—1at % Y | 80 | 6-10 | 400 | 90 | 3 | 29 |
| 3 | Al—2at % Ni—1at % Dy | 80 | 6-10 | 400 | 93 | 2.6 | 23 |
| 4 | Al—2at % Ni—0.4at % Nd | 80 | 6-10 | 400 | 91 | 2.7 | 25 |
| 5 | Al—3at % Ni—0.5at % Nd | 80 | 6-10 | 400 | 82 | 4.1 | 35 |
| 6 | Al—3at % Ni—0.6at % Nd | 80 | 6-10 | 400 | 94 | 2.5 | 19 |

TABLE 2-continued

| No. | Composition | Rolling Conditions | | | | Amount of | |
| --- | --- | --- | --- | --- | --- | --- | --- |
| | | Total Processing Rate (%) | Processing Rate Per Pass (%) | Temp (°C.) | Ratio of Aligned Components (%) *1 | Bulky Compounds (number/mm$^2$) *2 | Number of Arcs |
| 7 | Al—2at % Ni—1at % Nd | 55 | 3-5 | 400 | 75 | 3 | 58 |
| 8 | Al—2at % Ni—1at % Y | 55 | 3-5 | 400 | 70 | 3.1 | 62 |
| 9 | Al—3at % Ni—0.6at % Nd | 55 | 3-5 | 400 | 69 | 4 | 69 |

*1 Of compounds whose aspect ratio was 2.5 or higher and whose equivalent diameter was 0.2 μm or larger, those whose major axis direction was within the range of ±30 degrees with respect to the direction which was parallel to the plane of the target
*2 Bulky compounds whose equivalent diameter was over 5 μm Table 2 indicates the following. When there are the specified amount of compounds specified in the present invention, the major axis direction of the specified compounds is aligned with the direction which is approximately parallel to the plane of a target as in the case of No. 1 through No. 6 in Table 2 and production of bulky compounds is suppressed, it is possible to secure the mechanical strength, sufficiently suppress development of arcs during the initial stage of sputtering and achieve more stable sputtering.

What is claimed is:

1. An Al-base alloy sputtering target comprising Ni and one or more rare earth elements, wherein there are $5.0 \times 10^4/mm^2$ or more compounds at least containing Ni or rare earth elements whose aspect ratio is 2.5 or higher and whose equivalent diameter is 0.2 μm or larger, when a cross sectional surface perpendicular to the plane of the target is observed at a magnification of 2000 or higher, wherein
    (a) 80% or more of the compounds have the major axis direction on the plane vertical to the plane of the target and are within the range of ±30 degrees with respect to the direction which is parallel to the plane of the target, and
    (b) the number of bulky compounds whose equivalent diameter exceeds 5 μm is 500/mm$^2$ or fewer.

2. An Al-base alloy sputtering target according to claim 1, wherein the rare earth element is one or more elements selected from the group consisting of Nd, Y and Dy.

3. An Al-base alloy sputtering target according to claim 1, wherein there are $6.0 \times 10^4/mm^2$ or more compounds at least containing Ni or rare earth elements whose aspect ratio is 2.5 or higher and whose equivalent diameter is 0.2 μm or larger, when a cross sectional surface perpendicular to the plane of the target is observed at a magnification of 2000 or higher.

4. An Al-base alloy sputtering target according to claim 1, wherein there are $8.0 \times 10^4/mm^2$ or more compounds at least containing Ni or rare earth elements whose aspect ratio is 2.5 or higher and whose equivalent diameter is 0.2 μm or larger, when a cross sectional surface perpendicular to the plane of the target is observed at a magnification of 2000 or higher.

5. An Al-base alloy sputtering target according to claim 1, wherein 85% or more of the compounds have the major axis direction on the plane vertical to the plane of the target and are within the range of ±30 degrees with respect to the direction which is parallel to the plane of the target.

6. An Al-base alloy sputtering target according to claim 1, wherein 90% or more of the compounds have the major axis direction on the plane vertical to the plane of the target and are within the range of ±30 degrees with respect to the direction which is parallel to the plane of the target.

* * * * *